March 7, 1961 F. P. HILL ET AL 2,974,225

RADIO RECEIVER

Filed Jan. 9, 1957

INVENTORS.
FREDERICK P. HILL
ROBERT G. HARTFIELD
BY
Mueller & Aichele
ATTYS.

United States Patent Office 2,974,225

Patented Mar. 7, 1961

2,974,225

RADIO RECEIVER

Frederick P. Hill, Elgin, and Robert G. Hartfield, Berwyn, Ill., assignors to Motorola, Inc., Chicago, Ill., a corporation of Illinois Filed Jan. 9, 1957, Ser. No. 633,298

8 Claims. (Cl. 250—20)

This invention relates to radios, and more particularly to sensitivity controls for auto radios having search tuners.

Search tuners have been provided for auto radios which, upon actuation by a listener, energize a drive which tunes the radio from a strong signal station of one frequency to the next strong signal station of another frequency. The drive tunes the set continuously until the set approaches a tuned condition with respect to a station, at which point the received amplified signal stops the drive just as the radio is tuned to the station. The termination of the tuning of the search tuner is dependent upon the strength of the radio signal received from the transmitter of the station to which the receiver is tuned. Such signals vary greatly in strength with strong signals being present in areas adjacent to the transmitters, as in urban areas, and weak signals being present in areas which are remote from the transmitters. In the rural or weak signal areas, it is important to have high sensitivity of the radio during the search tuning so that the weaker signals will actuate the search tuner to stop precisely on the desired radio station. It is also important in the urban or strong signal areas to have low sensitivity in the amplification of the radio signals so that only a limited number of stations will be tuned, and stations in other cities will not provide sufficiently strong signals to stop the search tuning.

Manually adjustable sensitivity controls for providing high sensitivity in weak signal areas and low sensitivity in the strong signal areas are known. Such sensitivity controls serve during search tuning to reduce radio signals amplified by the radio circuit so that signals from remote transmitters are not strong enough to stop on weaker stations, and then, after search tuning is stopped on a strong signal, the normal amplification of the radio signals is restored so that the radio operates at high efficiency during listening. Such sensitivity controls also can be adjusted to provide high or full sensitivity in the weak signal areas so that signals only from the stronger transmitters would be capable of stopping the search tuning on those transmitters. However, such sensitivity controls have had normally closed relay contacts for removing the search sensitivity controls from the radio circuit after the radio is tuned to the station sought, and it is important to maintain such contacts closed during the operation of the radio on that station to prevent noise in the reproduction. Since vibration and shock are encountered in the operation of automobiles, the normally closed relay contacts may be momentarily opened creating undesirable noise in the audio output of the radios. Where high voltage power supplies are available in automobile radios, high voltage relays having spring contacts sufficiently strong to minimize such unintentional opening of the contacts may be used. However, such power supplies have high power loss and increase the cost, weight, and maintenance of the radios. Hybrid radio sets are now being used having transistor output stages and using the 12-volt D.C. power supply of the automobiles directly without vibrators and transformers. One such radio having a transistor output is manufactured by Motorola, Inc. In such hybrid sets, the relay contact springs of the low voltage relays must be sufficiently weak to permit the operation of the relays by the current of a vacuum tube operating directly from a 12-volt power source. Such weaker relay contact springs tend to open to interrupt the sensitivity control circuit during jars from the operation of the automobile and thus to create noise. Hitherto, there has been no satisfactory sensitivity control for use with such low voltage radios.

An object of the invention is to provide new and improved sensitivity controls for search tuners of auto radios.

Another object of the invention is to provide auto radios having search tuners in which no noise is produced in the radio during operation in which the radio is subjected to jars.

A further object of the invention is to provide sensitivity controls in search tuners of radios in which there are no normally closed relay contacts connected in the radio circuits per se.

One feature of the invention is the provision of a radio having a sensitivity control serving to shunt normal biasing impedances of an amplifier stage during search tuning without disconnecting the normal biasing circuit so that there are no normally closed relay contacts in the biasing circuit of the amplifier stage during listening operation.

Another feature of the invention is the provision of a grid-cathode biasing circuit of an amplifier stage of a radio in which the voltage level of the grid is decreased by bringing it closer to ground through normally open contacts of a relay closed during search tuning.

Another feature of the invention is the provision of a bleeder circuit supplying a constant reference voltage point for a cathode of an amplifier tube and a bias resistor connected to a signal grid of a tube and a sensitivity control resistor and normally open switching means for shunting the grid to a lower voltage point than the reference voltage point during search tuning in strong signal areas to reduce gain of the tube.

A further feature of the invention is the provision of a bleeder circuit between a positive voltage supply point and ground supplying a constant voltage above ground to a cathode of an amplifier tube, a screen grid connected to the positive voltage supply point by a bias resistor and connected to a plate of the tube through another resistor, and a shunting resistor and a pair of normally open contacts for connecting the screen grid to ground to reduce gain of the tube during search tuning.

Referring now to the drawings.

Figures 1, 2, 3:
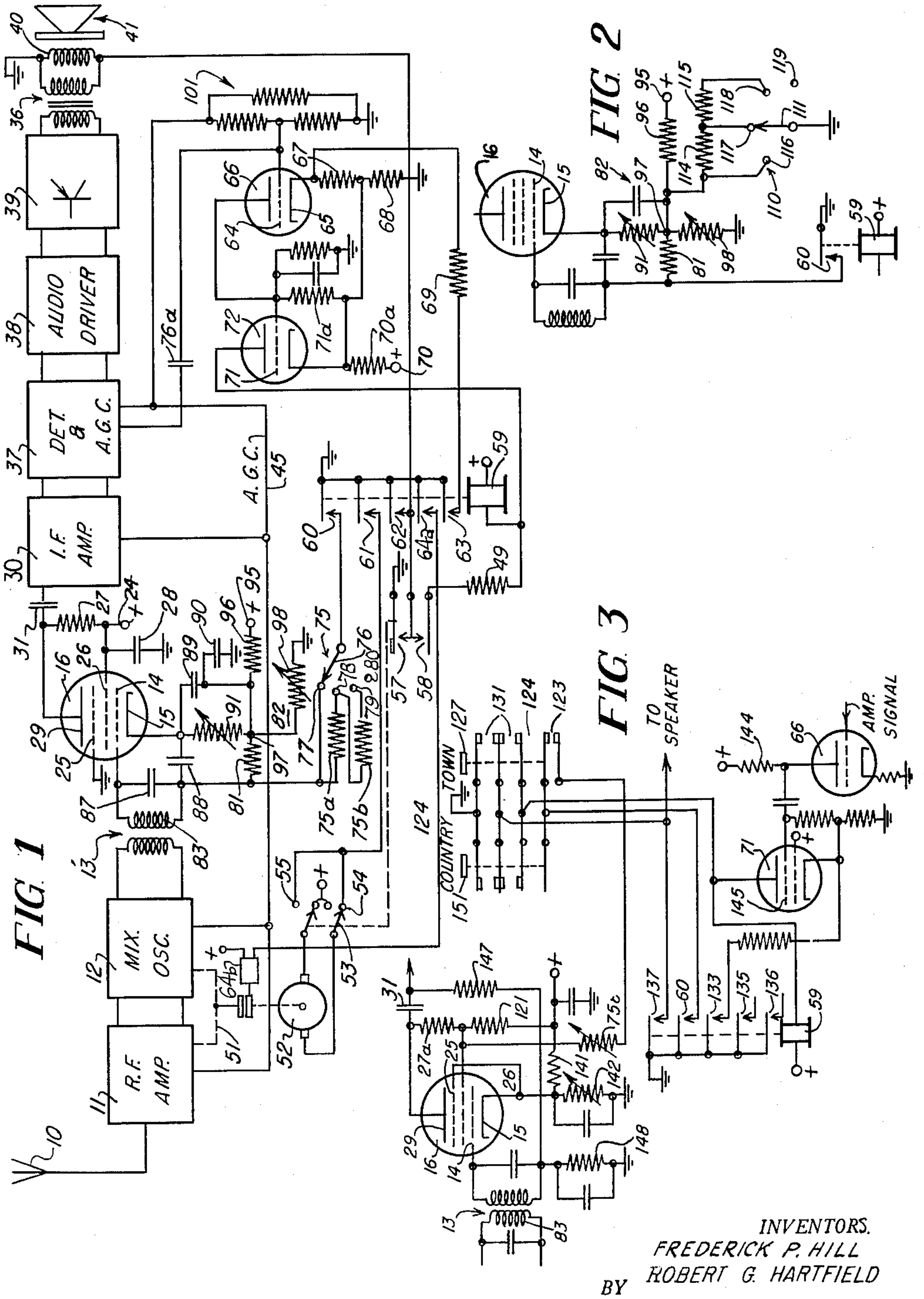
Fig. 1 is a diagrammatic view of a radio forming one embodiment of the invention.
Fig. 2 is a diagrammatic view of a portion of a radio forming an alternate embodiment of the invention.
Fig. 3 is a diagrammatic view of a portion of a radio forming another alternate embodiment of the invention.

The invention provides sensitivity control of an amplifier stage of a radio receiver having a search tuner by changing the amplification during operation of the tuner. Stopping of the tuner is dependent upon signals of at least a given strength supplied by the amplifier stage so that, according to the extent of change of the amplification, weaker signal stations do not stop the tuner. The sensitivity control includes a resistor forming part of a voltage-divider and connecting a cathode of one of the stages to ground to bias the cathode above ground, a second resistor connecting a grid of that stage to an intermediate point on the voltage divider and a set of normally open contacts of a search tuning relay for shunting the resistors during search tuning to lower the voltage of the grid relative to the cathode to reduce the sensitivity of the stage.

A circuit forming one embodiment of the invention includes a voltage divider biasing a cathode of the amplifier stage relative to ground and a large grid resistor connects a control grid of the amplifier stage to form a D.C. grid-cathode path. A relay having normally open contacts connected to the grid is energized during search tuning to connect the resistor and the grid to ground, thereby increasing the grid-cathode bias to reduce amplification of the amplifier stage. A manually adjustable resistor may be connected in series with the relay contacts and the grid to selectively control the increase of grid-cathode bias during search tuning. The B-plus voltage also may be connected to the voltage divider and the resistor through a dropping resistor to stabilize the reference voltage level at that point during search tuning operation of the radio. Instead of the adjustable resistor being connected between the grid and the relay contacts, it may be connected between ground and the point on the voltage divider that the grid resistor and the dropping resistor are connected, and serves to control the reference voltage level. In this circuit, the relay contacts connect the grid directly to ground when the relay is operated. A circuit forming a third embodiment of the invention includes a bleeder circuit connecting B-plus to ground and having an intermediate point connected to a cathode of one of the stages of a radio receiver, a second bleeder circuit connecting B-plus to the plate of that stage and having intermediate points connected to the screen grid of that stage, and a resistor connecting the screen to ground through normally open contacts of a search tuning relay for lowering the voltage of the screen grid during search tuning.

In the radio shown in Fig. 1, there is provided an antenna 10 for gathering radio signals from transmitters, and transmitting the signals to a radio frequency amplifier stage 11. The amplified radio frequency signals are applied to a mixer-oscillator stage 12 which feeds intermediate frequency signals to a transformer 13. The radio circuit is of a superheterodyne type operable on a 12-volt D.C. power supply. The transformer 13 applies the signal to a control grid 14 and a cathode 15 of a tube 16 forming a first intermediate frequency amplifier stage.

The tube 16 is a pentode having a suppressor grid 25 connected to ground and a screen grid 26 connected to a B-plus or positive terminal 24 of a battery of an automobile having a normal voltage of 12 volts D.C. but which may be from 11 to 15 volts D.C. The grid 26 is bypassed by capacitor 28. A resistor 27 connects plate 29 of the tube to the B-plus supply 24, and the output of the tube 16 is connected by a capacitor 31 to a second intermediate frequency amplifier stage 30, whose output is connected to detector and automatic volume control stage 37 of a well-known type which, in turn, feeds an audio driver stage 38 driving a power transistor amplifier stage 39. The stage 39 forms an output stage driving a transformer 36 which in turn feeds power to a coil 40 of a loudspeaker 41 of the radio. The stage 37 is provided with a radio frequency filter which filters out intermediate frequency signals from the signals supplied thereto and feeds audio signals onto the driver stage 38, which are amplified by the driver and by the transistor power amplifier stage 39 to drive the speaker 41. An automatic gain control lead 45 serves to connect the stages 11, 12, 16, 30 and 37 back to the stage 11 to keep the total gain of the circuit substantially uniform regardless of small variations in the strength of signals from the stage 11.

The units 11 and 12 are tunable by a connection 51 which may be operated either manually or by a reversible search tuning motor 52. When the motor 52 is actuated and switch 53 is in its upper position, it operates to tune the stages 11 and 12 in a frequency decreasing direction. When the switch 53 is in its lower position connecting contacts 54 and 55 and search tuning is initiated, the motor 52 is driven in a direction to continuously tune the stages 11 and 12 in a frequency increasing direction. The switch 53 is mechanically actuated in either direction by the position of the tuner carriage. The closure of relay contacts is accomplished by manually operating the switch including contacts 57 and 58 which are connected to ground. The contacts 57 close first to mute the speaker 41, and then the contacts 58 close to connect a relay winding 59 through a pull-in resistor 49 to ground which actuates the relay to close contacts 60, 61, 62, 63 and 64a. Closure of contacts 61 energizes the motor 52 and closure of contacts 64a energizes a clutch solenoid 64b. The motor starts the search tuning of the stages 11 and 12. Closure of the contacts 62 grounds the coil 40 of the speaker 41 to mute the speaker 41 completely so that no sounds are emitted therefrom during search tuning.

Closing of the contacts 63 of the relay switches resistor 69 across the series connected resistors 67 and 68. The interconnection of resistors 67 and 68 is connected to B+ through resistor 70a. With resistor 69 switched into the circuit, the bias of tube 72 is reduced sufficiently that it conducts to maintain relay 59 energized to continue search tuning of stage 11, 12. At the same time, the voltage at the cathode 65 of trigger tube 66 is reduced. The anode voltage for tube 66 is supplied through resistors 70a and 71a. As further described below, when a signal of sufficient size is tuned and applied to the control grid 64 through capacitor 76a, trigger tube 66 is rendered highly conductive to cause cutoff of tube 72, the control grid 71 of which is connected to the anode of tube 66. In this way, the relay 59 would become deenergized.

During the search tuning, the signals received by the antenna 10 are amplified by the stages 11, 12 and 16, and are fed to the second intermediate amplifier stage 30, which also amplifies the signals and feeds them to the detector stage 37 and through a condenser 76a to the grid 64 of the trigger tube 66. The sensitivity control includes a resistor 75 and a switch 76 movable selectively by an operator of the radio to any one of taps 77, 78, 79 and 80. The resistor 75 has resistor segments 75a and 75b selectively connected through the taps. The resistor 75 is connected to a resistor 81 having a high resistance and forming part of a star network 82. The resistors 75 and 81 are connected through a secondary winding 83 of the transformer 13 to the control grid 14 of the pentode 16. A condenser 87 forms a tuned circuit with the winding 83, and radio frequency condensers 88, 89 and 90 permit radio frequency signals to be transmitted between the grid 14 and cathode 15 and to a midpoint 97 of the star network 82. A variable resistor 91 of the star network 82 biases the grid 14 and the cathode 15 during normal or listening operation of the radio. Resistors 96 and 98 connected from the B-plus terminal 95, connected to the positive terminal of the 12-volt battery supply, to ground form a voltage divider or bleeder for controlling the voltage level of the mid-point 97 and maintaining the voltage at the midpoint 97 constant whether or not the tube 16 is conducting current. Resistor 98 is variable for adjusting the voltage at point 97 and is substantially lower in resistance than the resistor 81.

The stage 37 supplies automatic gain control voltage to a voltage divider 101 connected to the grid 64 of the trigger tube 66. The stage 37 also is connected through the condenser 76a to the grid 64 for transmitting the amplified carrier signals to the tube 66, which signals are large when the units 11 and 12 are almost tuned to a station. The stage 37 is of a type well known to the radio art and the signals transmitted therefrom to the grid 64 are effected in a manner well known to the search tuning art. The signal level depends on the degree of amplification of the tube 16 and upon the strength of the signals received by the antenna 10. When a tuned condition is approached during search tuning, the signal from the stage 37 to the tube 66 makes the tube 66 conductive to cut off the tube 72 and the relay 59.

The degree of amplification of the intermediate frequency amplifier tube or stage 16 during search tuning is controlled by the network 82 and the setting of the resistor 75. During normal or listening operation of the radio circuit, the full sensitivity or amplification of the tube 16 is effected by grid-cathode bias determined by the variable resistor 91 through which current always flows and the setting of the resistor 98 which controls the reference voltage level to which the grid 14 and cathode 15 are biased. Since there is no current flow between the grid 14 and the cathode 15 during listening operation, there is no voltage drop across the resistor 81 then. However, during search tuning, the relay 59 is energized to close the contacts 60, which connect the grid 14 and resistor 81 to ground through the sensitivity control resistor 75. The voltage drop across the resistor 81 increases the grid-cathode bias to lessen the sensitivity of the tube 16. The sensitivity is controlled selectively by the setting of the resistor 75. Minimum sensitivity of the tube 16 is provided when the contactor 76 engages the tap 77 so that only when the stages 11 and 12 are tuned to a transmitter having a very strong signal to the antenna 10 is there a signal from the detector unit 37 large enough to trigger the tube 66. This setting of the resistor 75 is for strong signal areas. When the tube 66 is so triggered, the voltage of the grid 71 is lowered to sharply reduce the conductivity of the tube 72 to drop out the relay 59. When the relay 59 is dropped out, the contacts 60, 61, 62 and 63 open. When the contacts 60 open the connection of the resistor 75 and the grid 14 to ground is broken and the full sensitivity of the tube 16 is restored for listening to the station to which 11 and 12 are tuned. When the contacts 61 open the operating circuit to the motor drive 52 is broken to stop tuning of the units 11 and 12. The contacts 63 open to keep the tube 66 conductive.

When the radio is operated in signal areas of intermediate strength, the contactor 76 is set manually in engagement with the tap 78 to damp the stage 16 less during tuning. Decreased damping may be effected by setting the contactor on the tap 79 for weaker signal areas, and for very weak signal areas, the contactor is set in engagement with the dead tap 80 to provide full sensitivity during search tuning.

The resistance of the resistor 81 is very high relative to that of the resistor 98. Hence, the resistor 81 creates potential drop during search tuning, but does not have any significant effect on the voltage level of the point 97 of the network 82. The resistances of the resistor segments 75*a* and 75*b* also are high so that they serve with the resistor 81 as a voltage divider with a wide range of division of the voltage between the point 97 and ground. The resistance of the resistor 96 also is high compared with that of the resistor 98 so that the maximum voltage of the point 97 is 3.0 volts. The range of resistances of the resistor 91 should be sufficient to provide desired grid-cathode bias.

*Embodiment shown in Fig. 2*

In this embodiment of the invention, the radio and search tuning circuits are identical with those shown in Fig. 1 except as indicated hereinbelow. The grid 14 of the tube 16 is biased relative to the cathode 15 by means of the resistor 91 and the network 82 includes resistors 81, 91, 96 and 98, and also includes a sensitivity control including an adjustable resistor 110 having a switch 111 connected to ground. The resistor 110 includes segments 114 and 115 and taps 116, 117, 118 and 119. The terminal 95 is connected to a positive terminal of a 12-volt battery voltage supply. The relay 59 has its normally open contacts 60 connecting the resistor 81 and the grid 14 directly to ground when the relay 59 is energized during search tuning. The tapped adjustable resistor 110 is connected to the midpoint 97 of the network 82 and serves with the resistor 98 to control the reference voltage level of the point 97. The series resistance of the segments 114 and 115 of the resistor 110 should be slightly less than the maximum resistance of the resistor 98. The resistances of the segments 114 and 115 may be equal to one another.

When the switch 111 is set in engagement with the dead contact 119 and the relay 59 is energized to close contacts 60 to effect search tuning, the control resistor 110 is cut out and minimum sensitivity is present. When the switch is set on the contact 118, there is voltage drop across the resistor 81 and the potential of the grid 14 is at ground during search tuning so that there is high gain-reduction of the intermediate amplifier tube 16. This adjustment of the resistor 110 is useful in both strong and weak signal areas. When the switch 111 is set in engagement with the contact 117, approximately half of the resistance of the resistor 110 is connected in series between the point 97 and ground so that the voltage of the point 97 is lowered and less current flows through the resistor 81 and the contacts 60 to ground during search tuning to decrease the grid-cathode bias over listening condition but less than when the switch 111 is set in engagement with the tap 118. Thus, intermediate sensitivity or damping of the tube 16 is provided for use in weak or intermediate signal areas. For maximum sensitivity of the tube 16 during search tuning, the switch 111 is set on the contact 116 so that none of the entire resistor 110 is interposed between ground and the point 97 of the network 82. With this setting, there is no gain-reduction of the tube 16 during search tuning since the grid 14 remains at the same voltage as the point 97. The provision of the resistor 110 provides adjustment of sensitivity control in steps which could not be effected in its absence, although, if the resistor 110 were omitted, the variable resistor 98 could be adjusted manually to provide the desired degree of damping during search tuning. It should be noted that as the resistor 110 is adjusted for greater sensitivity for search tuning, it brings the point 97 closer to ground potential during listening operation as well so that a greater plate voltage is provided. Thus, as the control resistor 110 is set for search tuning in weaker signal areas, greater amplification of the stage 16 is provided during listening operation.

*Embodiment shown in Fig. 3*

In this sensitivity control circuit, B-plus voltage to a plate 29 of a tube 16 forming the first intermediate frequency amplifier stage is supplied through resistors 121 and 27*a*, and a screen grid 26 is connected to the junction of the resistors 27*a* and 121. The screen grid 26 also is connected to ground through a variable sensitivity control resistor 75*c*, normally open contacts 60 of a search tuner relay 59, and settable contacts 123 of a search tuner switch 124. When a "town" button 127 is pressed momentarily, the contacts 123 are set in closed positions, and contacts 131 are closed momentarily to connect the relay 59 to ground to energize the relay and a tube 71 to energized conditions. Relay contacts 133 hold in the tube 71 and the relay 59. Relay contacts 135 and 136 hold the search tuner drive energized, and contacts 137 mute the speaker of the radio receiver during search tuning.

When the relay contacts 60 are closed, as occurs in search tuning, the resistors 75*c* and 121 draw a D.C. current, and, the resistor 75*c* being much smaller than the resistor 27*a*, the resistor 121 draws a much higher current than during listening so that the voltage of the screen grid 26 is lowered substantially toward ground potential. This reduces the sensitivity of the tube substantially. Also, the voltage of the plate 29 is lowered to reduce the gain of the tube 16. The voltage of the cathode is kept up during search tuning by resistors 141 and 142 forming a bleeder circuit or voltage divider. Thus, the resistor 121 forms a screen grid-cathode bias resistor to lower screen grid-cathode potential difference during search tuning. Resistors 147 and 148 bias a control grid 14. When the radio receiver circuit tunes to a strong transmitter signal while searching, the automatic volume control sends a strong signal to a trigger tube 66 to make it conductive, and the plate voltage thereof is dropped by a resistor 144 and also drops voltage of a grid 145 of tube 71 to drop out relay 59 and stop search tuning. The shunt circuit through the sensitivity control resistor 75c then is broken and the tube or stage 16 is restored to full sensitivity and gain.

When a "country" or weak signal area button 151 is depressed, search tuning is effected as described above for "town" search tuning, but the contacts 123 are set open so that the sensitivity of the stage 16 is not reduced during search tuning. That is, the contacts 123 are open to prevent the shunt of the plate circuit by the resistor 75c. Thus, full sensitivity is utilized during search tuning in weak signal areas.

The above-described circuits serve to search tune with any desired degree of sensitivity and when the search tuning is completed there are no normally closed contacts of the relays 59 connected to the radio circuits per se so that vibration or jarring does not cause noise in the radios even though the contact springs of the relay are sufficiently weak to permit easy operation thereof by the low voltage relays. Also, the gain-reduction is effected at a late stage during the amplification of the signals received by the radio so that more precise gain-reduction may be effected than where the damping is effected on earlier stages of the radios. While the sensitivity controls described above are in the first intermediate frequency amplifier stage 16, the controls can obviously be removed therefrom and inserted into the second intermediate frequency amplifier stage 30.

In the above-described embodiments of the invention, the following circuit constants are used, and these are listed herein only by way of example and are not intended to limit the invention in any way:

| | | |
|---|---|---|
| Resistor **69** | ohms | 560 |
| Resistor **75a** | megohms | 1.0 |
| Resistor **75b** | do | 10.0 |
| Resistor **75c** | ohms | 1000 |
| Resistor **81** | megohms | 0.100 |
| Resistor **91** | ohms | 1000 |
| Resistor **96** | do | 8000 |
| Resistor **98** | do | 2000 |
| Resistor **101** | do | 470,000 |
| Resistor **114** | do | 2200 |
| Resistor **115** | do | 2200 |
| Resistor **121** | do | 470 |
| Resistor **141** | kilo-ohms | 4.7 |
| Resistor **142** | do | 2 |
| Resistor **147** | megohm | .220 |
| Resistor **148** | do | 1 |
| Capacitor **87** | micromicrofarads | 39 |
| Capacitor **88** | microfarad | .01 |
| Capacitor **89** | do | .01 |
| Tube **16** | | 12AF6 |

We claim:

1. In a superheterodyne search tuning radio including an intermediate frequency amplifier tube having a cathode and a control grid, a search tuner, momentary manually operable means for starting the search tuner, relay means controlled by the manually operable means for holding the search tuner in operation, said relay having a set of normally open contacts, and means operable by a signal from the tube to deenergize the relay means to stop the search tuner, the improvement comprising a grounded point, a voltage divider connecting the cathode to the grounded point, a resistor connecting the grid to an intermediate point of the voltage divider, whereby a predetermined grid-cathode bias is provided by the portion of the voltage divider between the resistor and the cathode for listening operation of the radio, a positive voltage point, a resistor connecting the positive voltage point to said intermediate point of the voltage divider to stabilize the voltage at that point, and circuit means completed by closing of the normally open contacts of the relay for connecting the grid to the grounded point to raise the grid-cathode bias and lower the receiver sensitivity during search tuning operation of the radio.

2. In a search tuning radio receiver including an amplifier stage for modulated radio signals and having a tube with a screen grid and an anode and a cathode and further having a relay operable during search tuning to close a pair of contacts of the relay grounded on one side; the combination therewith of a positive voltage terminal, first resistor means connecting the terminal to the screen grid and to the anode, second resistor means connecting the cathode to ground, and a sensitivity control resistor connected to the relay contacts and to the screen grid to form a voltage divider with a portion of the first resistor means to lower the voltage of the screen grid and the anode during search tuning to reduce the sensitivity of the amplifier stage for search tuning of only high level signals.

3. A radio receiver adapted to operate directly from a potential source of the order of 12 volts, including a motor-driven search tuner and control circuit means for energizing the motor and automatically de-energizing the same when a signal is tuned and applied to said circuit means with a given strength, said control circuit means including an electron valve and a relay operable thereby directly from the potential source, said relay having contacts adapted to close upon energization thereof during search tuning, an intermediate frequency amplifier in the receiver for translating a signal to be applied to said control circuit means, said amplifier including an electron valve having cathode, control grid, screen grid, and anode electrodes, a direct current energization circuit for said electron valve including means coupling said cathode electrode to a reference point and circuit means interconnecting said screen grid and anode electrodes, said direct current energization circuit further including first resistor means coupling said circuit means to a terminal providing a positive potential, a manually operable switch, and variable resistor means series coupled with said switch and a pair of said contacts of said relay between the reference point and the interconnection of said circuit means with said first resistor means, whereby closing of said switch during search tuning provides voltage divider action with said first resistor means and said variable resistor means to lower the potential of the screen grid and anode electrodes and reduce the sensitivity of said amplifier for search tuning of only signals of high level.

4. A radio receiver including a motor driven search tuner with control circuit means for energizing the motor and automatically deenergizing the same when a signal is tuned and applied to said circuit means with a given strength, said control circuit means including a relay having only contacts adapted to close on energization thereof during search tuning, an amplifier circuit for translating a signal to be demodulated in said receiver and for application to said control circuit means, said amplifier circuit including an electron valve having cathode, grid and anode electrodes, a direct current energization circuit for said electron valve including resistor means coupling said cathode electrode to a reference point and further resistor means coupling said anode electrode to a positive potential source thereby energizing said valve for signal translation at relatively high amplifier sensitivity, and shunting resistor means series coupled with a pair of said contacts of said relay between one of said resistor means of said direct current energization circuit and the reference point for reducing the gain of said electron valve, whereby closing said contacts during search tuning lowers the sensitivity of said amplifier circuit for search tuning of only signals of high level.

5. A radio receiver adapted to operate directly from a potential source of the order of 12 volts, including a motor driven search tuner and control circuit means for energizing the motor and automatically deenergizing the same when a signal is tuned and applied to said circuit means with a given strength, said control circuit means including an electron valve and a relay energized directly from the potential source by said electron valve, said relay having contacts adapted to close upon energization thereof during search tuning, an amplifier circuit for translating a received signal for application to said control circuit means, said amplifier circuit including a further electron valve having cathode and anode electrodes, a direct current energization circuit for said further electron valve including means coupling said anode electrode to the potential source and bias resistor means coupling said cathode electrode to a reference point for establishing a given gain in said amplifier circuit, manually operable switching means for energizing said control circuit means to operate said motor driven tuner, and resistor means series coupled with a pair of contacts of said relay means between a portion of said direct current energization circuit and the reference point for reducing the gain of said amplifier circuit with said relay energized thereby reducing the search tuning sensitivity of the receiver by operation of said switching means.

6. A superheterodyne radio receiver including a motor driven search tuner and control circuit means for energizing the motor and automatically deenergizing the same when a signal is tuned and applied to said circuit means with a given strength, said control circuit means including a relay having only contacts adapted to close upon energization thereof during search tuning, an intermediate frequency amplifier circuit for translating a signal for application to said control circuit means, said amplifier circuit including an electron valve having cathode, grid and anode electrodes, a direct current energization circuit for said electron valve including variable resistor means coupling said cathode electrode to a reference point and further resistor means coupling said anode electrode to a positive potential source, said energization circuit also including resistor means coupling said variable resistor means to the potential source for cathode bias of said electron valve, and shunting resistor means for lowering the gain of said electron valve, said shunting resistor means being series coupled with a pair of said contacts of said relay between a portion of said direct current energization circuit and to the reference point, whereby operation of said delay during search tuning lowers the sensitivity of said amplifier circuit for search tuning of only signals of high level.

7. A superheterodyne radio receiver including a motor driven search tuner and control circuit means for energizing the motor and automatically deenergizing the same when a signal is tuned and applied to said circuit means with a given strength, said control circuit means including a relay having contacts adapted to close upon energization thereof during search tuning, an amplifier circuit for translating a signal for application to said control circuit means, said amplifier circuit including an electron valve having cathode, grid and anode electrodes, a direct current energization circuit for said electron valve including means coupling said cathode electrode to a reference point and first resistor means coupling said anode electrode to a positive potential source, a manually operable switch, and shunting resistor means for lowering the gain of said electron valve, said shunting resistor means being series coupled with said switch and a pair of said contacts of said relay between a portion of said first resistor means and the reference point, whereby operation of said relay during search tuning provides a potential drop across a portion of said first resistor means to lower the anode electrode energization potential and reduce the sensitivity of said amplifier circuit for search tuning of only signals of high level.

8. A superheterodyne radio receiver including a motor driven search tuner and control circuit means for energizing the motor and automatically deenergizing the same when a signal is tuned and applied to said circuit means with a given strength, said control circuit means including a relay having only contacts adapted to close upon energization thereof during search tuning, an amplifier circuit for translating a signal for application to said control circuit means, said amplifier circuit including an electron valve having cathode, grid and anode electrodes, a direct current energization circuit for said electron valve including first resistor means coupling said cathode electrode to a reference point and second resistor means coupling said anode electrode to a positive potential source, said energization circuit also including third resistor means adapted to couple said first resistor means to the potential source and form a cathode bias network for said electron valve, fourth resistor means coupled between said grid electrode and said first resistor means, and means series coupling a pair of said contacts of said relay between said fourth resistor means and the reference point for increasing the bias of said electron valve and lowering the sensitivity of said amplifier circuit with said relay operated for search tuning of only signals of high level.

References Cited in the file of this patent

UNITED STATES PATENTS

| | | |
|---|---|---|
| 2,174,641 | Sinninger | Oct. 3, 1939 |
| 2,744,193 | Schwarz | May 1, 1956 |
| 2,773,193 | Andrews | Dec. 4, 1956 |
| 2,791,685 | Hill | May 7, 1957 |
| 2,800,582 | Doriot | July 23, 1957 |
| 2,828,451 | Cole | Mar. 25, 1958 |